(12) United States Patent
Lee et al.

(10) Patent No.: US 7,701,036 B2
(45) Date of Patent: Apr. 20, 2010

(54) INDUCTOR WITH PLURAL COIL LAYERS

(75) Inventors: Jae-sup Lee, Yongin-si (KR);
Dong-hyun Lee, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 304 days.

(21) Appl. No.: 11/370,973

(22) Filed: Mar. 9, 2006

(65) Prior Publication Data

US 2006/0249810 A1    Nov. 9, 2006

(30) Foreign Application Priority Data

May 4, 2005    (KR) .................. 10-2005-0037669

(51) Int. Cl.
*H01L 23/58*    (2006.01)

(52) U.S. Cl. ................ 257/531; 257/277; 257/E21.022
(58) Field of Classification Search ................ 257/531, 257/277, E21.022
See application file for complete search history.

(56) References Cited

U.S. PATENT DOCUMENTS

| 6,169,470 B1 * | 1/2001 | Ibata et al. ...................... 336/83 |
| 6,429,504 B1 * | 8/2002 | Beaussart et al. ........... 257/531 |
| 2004/0119574 A1 * | 6/2004 | Lee et al. ...................... 336/200 |

* cited by examiner

*Primary Examiner*—Tan N Tran
(74) *Attorney, Agent, or Firm*—Sughrue Mion, PLLC

(57) ABSTRACT

An inductor with plural coil layers includes a base wafer; a plurality of insulating layers sequentially laminated on one surface of the base wafer; and a plurality of coil layers built in the plurality of insulating layers, respectively, and having different magnetic flux passage areas.

10 Claims, 7 Drawing Sheets

FIG. 10

|  | FIG.5(L200W4S6) | FIG.6(L200W4S6) | FIG.7(L200W4S6) | FIG.8(L200W4S6) |
|---|---|---|---|---|
| L | 7.66nH(at 0.5GHz) | 7.77nH(at 0.5GHz) | 14.14nH(at 0.5GHz) | 12.67nH(at 0.5GHz) |
| SRF | 5.86GHz | 5.3GHz | 4.1GHz | 4GHz |
| Qmax | 3.18(at 3GHz) | 2.5(at 2.8GHz) | 3.236(at 2.3GHz) | 3(at 2.2GHz) |
|  | FIG.5(L200W4S2) | FIG.6(L200W4S2) | FIG.7(L200W4S2) | FIG.8(L200W4S2) |
| L | 12.57nH(at 0.5GHz) | 11.95nH(at 0.5GHz) | 16.66nH(at 0.5GHz) | 16.22nH(at 0.5GHz) |
| SRF | 4.07GHz | 3.7GHz | 3.42GHz | 3.44GHz |
| Qmax | 2.86(at 2.1GHz) | 2.44(at 1.9GHz) | 2.81(at 1.8GHz) | 2.7(at 1.7GHz) |
|  |  |  | FIG.7(L200W8S2) |  |
| L |  |  | 13.16nH(at 0.5GHz) |  |
| SRF |  |  | 3.6GHz |  |
| Qmax |  |  | 4.45(at 3GHz) |  |

INDUCTOR WITH PLURAL COIL LAYERS

This application claims priority from Korean Patent Application No. 10-2005-37669 filed on May 4, 2005 in the Korean Intellectual Property Office, the disclosure of which is incorporated herein by reference.

BACKGROUND OF THE INVENTION

1. Field of the Invention

Apparatuses and methods consistent with the present invention relate to an inductor with plural coil layers.

2. Description of the Related Art

In general, an integrated inductor is an indispensable passive element for impedance matching in an integrated circuit, and occupies the largest area in the integrated circuit. However, since impedance is a function of a frequency, the inductor should proportionally increase in size as the frequency decreases, so as to obtain the same impedance. Accordingly, there is a drawback in that the integrated circuit increases in size, thereby increasing a unit cost of products. Therefore, various attempts have been made for development of an integrated inductor having a size as small as possible while having a high inductance and quality factor (Q).

U.S. Pat. No. 6,593,201 discloses an integrated circuit having a conventional integrated inductor arranged. A first inductor and a second inductor are vertically arranged within an insulating metal layer supported by a substrate. The disclosed integrated circuit advantageously decreases in area and at the same time, increases in inductance as much as a mutual inductance by magnetic coupling. However, the disclosed integrated circuit has a drawback in that the inductor underlain on a characteristic of a complementary metal oxide semiconductor (CMOS) process gets worse characteristically, thereby deteriorating a quality factor. Further, U.S. Pat. No. 6,593,201 has a drawback in that, Cited Reference 1 only considers a structure where a single signal is applied, however the inductor is double in size in a circuit where a differential signal is applied.

U.S. Pat. No. 6,549,077 discloses another conventional integrated inductor. A drain inductor is connected to a drain of a transistor, a gate inductor is connected a gate of the transistor and applies a radio frequency (RF) input signal, and a source inductor is connected to a source of the transistor and allows a current flow in the same direction. Accordingly, disclosed integrated inductor has an advantage in that a magnetic flux generated by each inductor is magnetically coupled in the same direction, thereby increasing the inductance of the integrated circuit, and at the same time, decreasing the integrated circuit in area.

However, U.S. Pat. No. 6,549,077 has a drawback in that the transistor is disposed outside of a loop, having a square shape, of the inductors, thereby lengthening a lead line and increasing a parasitic component. Further, like U.S. Pat. No. 6,593,201, U.S. Pat. No. 6,549,077 considers only a structure where a single signal is applied, and therefore has a drawback in that the inductor is double in size in a circuit where a differential signal is applied.

SUMMARY OF THE INVENTION

The present invention provides an inductor with plural coil layers, that has a reduced size, and an improved Q value.

According to an aspect of the present invention, there is provided an inductor including: a base wafer; a plurality of insulating layers sequentially laminated on one surface of the base wafer; and a plurality of coil layers built in the plurality of insulating layers, respectively, and having different magnetic flux passage areas.

Each of the plurality of coil layers has a protrusion electrically connected with another predetermined layer.

Each of the plurality of coil layers being square open-loop shaped coils has a side, a width, and a height of predetermined lengths.

The magnetic flux passage area is proportional to the length of the side.

The length of the side increases proportional to a distance from a surface of the base wafer.

The length of the side decreases proportional to a distance from a surface of the base wafer.

The length of the side increases as getting distant from a vertically centered one of the plurality of coil layers.

The length of the side decreases as getting distant from a vertically centered one of the plurality of coil layers.

The plurality of coil layers are polygonal open-loop shaped coils.

BRIEF DESCRIPTION OF THE DRAWINGS

The above and/or other aspects of the present invention will be more apparent by describing certain exemplary embodiments of the present invention with reference to the accompanying drawings, in which:

FIG. 10 is a table comparing several measurement values for determining performances of inductors according to several embodiments of the present invention.

DETAILED DESCRIPTION OF THE EXEMPLARY EMBODIMENTS

Exemplary embodiments of the present invention will be described in greater detail with reference to the accompanying drawings.

The matters defined in the description such as a detailed construction and elements are provided to assist in a comprehensive understanding of the invention. However, the present invention is not limited to those defined matters. Also, well-known functions or constructions are not described in detail since they would obscure the invention in unnecessary detail.

Figure 1:
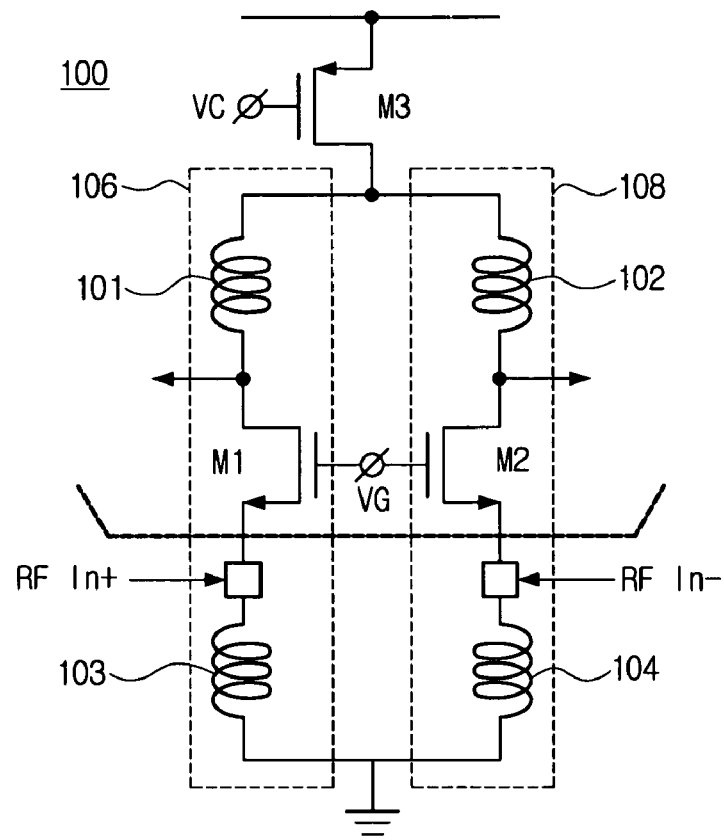
FIG. 1 is a circuit diagram illustrating an amplifier employing an inductor according to an exemplary embodiment of the present invention.
Figure 2:
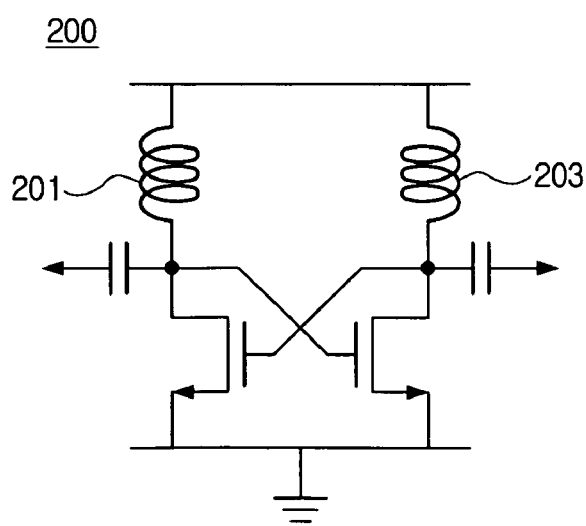
FIG. 2 is a circuit diagram illustrating an oscillator employing an inductor according to an exemplary embodiment of the present invention.

FIG. 1 is a circuit diagram illustrating an amplifier employing an inductor according to an exemplary embodiment of the present invention, and FIG. 2 is a circuit diagram illustrating an oscillator employing the inductor according to an exemplary embodiment of the present invention.

Referring to FIG. 1, the inductors 101, 102, 103, and 104 are employed in a pair of symmetric circuits 106 and 108 constituting a portion of the amplifier 100, respectively.

In order to properly maintain a characteristic of the amplifier and reduce power consumption thereof, it is essential that the inductors 101, 102, 103, and 104 minimize loss. In other words, the inductors 101, 102, 103, and 104 must necessarily have a higher quality factor value(hereinafter referred to as "Q").

In a case where an amplifier 100, having symmetrical circuits 106 and 108, shown in FIG. 1, employs the inventive inductors, it can serve as a differential amplifier and also generate high inductance and Q value. Therefore, it is desirable to employ the inventive inductor.

Referring to FIG. 2, the oscillator 200 performs a stable oscillation using a phenomenon of resonance between a capacitance and an inductance.

In the oscillator 200, one of the most important factors required for the inductors 201 and 203 is the Q value. The Q value is treated, of importance, as an index for energy efficiencies of the inductors 201 and 203.

If the Q value is high, the efficiencies of the inductors 201 and 203 increase and an oscillation spectrum is sharp. As the oscillation spectrum gets sharper, the variation of frequency decreases. This is a desired characteristic, in particular, for a voltage-controlled oscillator (VCO) circuit employed in a communication circuit.

Together with the Q value, another desired characteristic for the inductors 201 and 203 is symmetry. The VCO circuit integrated on a substrate and constituting a semiconductor device is embodied as a differential circuit structure. Therefore, the inductors 201 and 203 should have symmetrical characteristics for both of their terminals. In order to obtain the symmetrical characteristics, it is desirable that the inductors 201 and 203 are symmetrical in their layout.

If the oscillator 200 shown in FIG. 2 employs the inductors 201 and 203, it can serve as a differential amplifier and also generate high inductance and Q value. Therefore, it is desirable to employ the inventive inductor according to the exemplary embodiments of the present invention.

Figure 3:
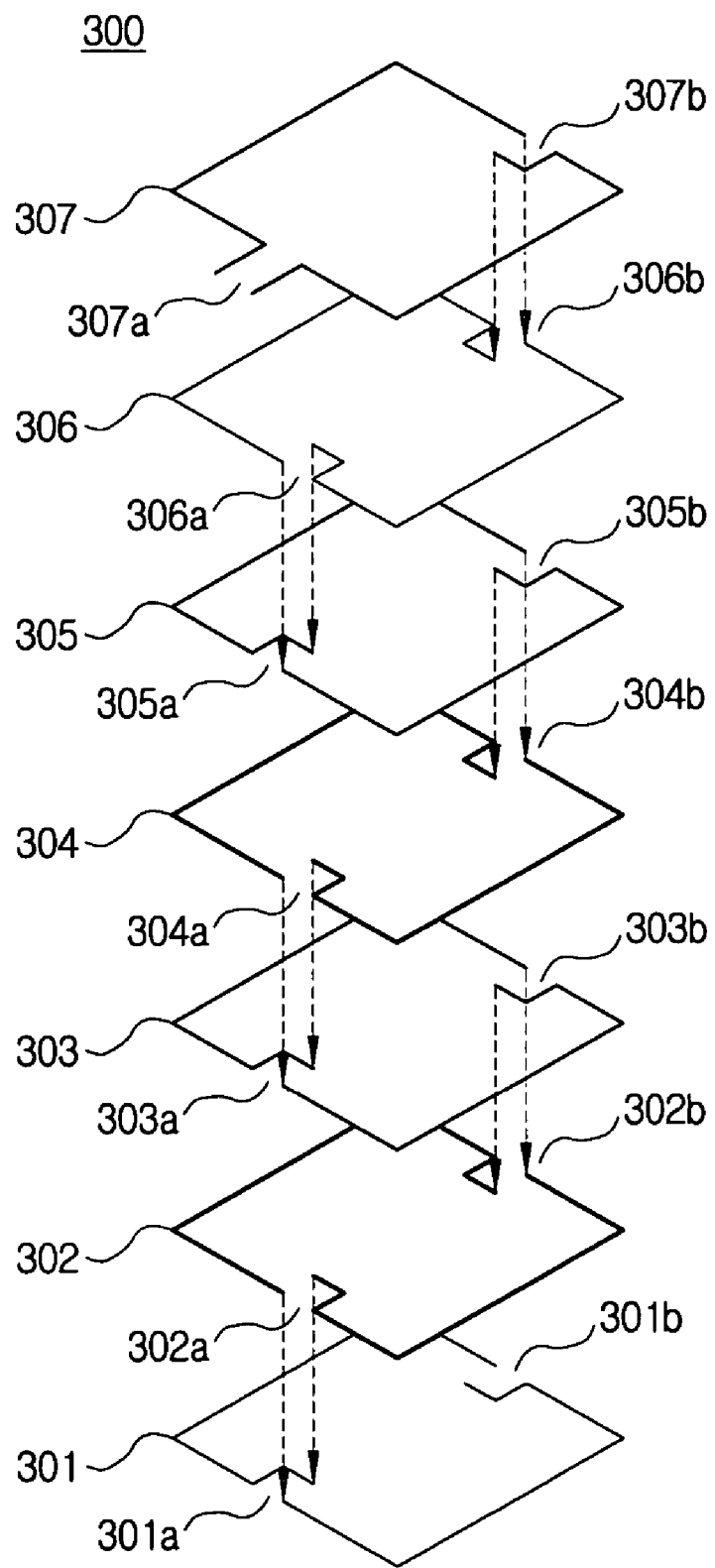
FIG. 3 is an exploded perspective view illustrating an inductor according to the first exemplary embodiment of the present invention.

FIG. 3 is an exploded perspective view illustrating an inductor according to the first exemplary embodiment of the present invention.

Referring to FIG. 3, in the inventive inductor 300, the first to seventh layers 301, 302, 303, 304, 305, 306, and 307 are laminated. Each of the first to seventh layers 301, 302, 303, 304, 305, 306, and 307 has a left and right symmetric coil, and is comprised of a coil of a single 1-line form extended so that a current can flow. This coil is formed to have a spiral shape, that is, a loop shape viewing on a plane, thereby generating a magnetic field and accordingly, storing and emitting energy.

Each of the layers 301, 302, 303, 304, 305, 306, and 307 constituting the inductor 300 has a rectangular open-loop shape, and has a side, a width, and a height of predetermined lengths. A magnetic flux passage area is determined depending on the length of the side of each of the layers 301, 302, 303, 304, 305, 306, and 307.

The magnetic flux passage area means a magnitude of current per unit time passing through a conductor, and increases as the conductor increases in area.

The present invention illustrates but is not limited to the rectangular shape of each of the layers 301, 302, 303, 304, 305, 306, and 307, and can be of course embodied to have various polygonal shapes such as a hexagonal shape or an octagonal shape.

In an electronic circuit employing the inductor 300, minimizing the size of a semiconductor chip is important, and the inductor 300 occupies the largest area. In other words, no matter how much area a transistor occupies, it is merely 10 μm but, in comparison to this, the inductor 300 can occupy even the slightest area of 200 μm.

Even though the inventive inductor 300 has the same area of 200 μm, to the minimum, if the inductor 300 is vertically stacked i.e., not occupying the area in a planar layout, the electronic circuit can reduce in total planar size and also can increase in inductance and improve in Q value.

In other words, the inductance capable of being used at a low frequency band of tens to hundreds of MHz is required more than in a frequency band of tens or hundreds of nHz. However, in the case where the inductor is employed in a planar layout, it increases in size and therefore, its application to the electronic circuit is difficult. Accordingly, like the inventive inductor 300, seven coil layers 301, 302, 303, 304, 305, 306, and 307 can be laminated in a layered form and used even at the low frequency band.

In FIG. 3, the current, sequentially flowing through the seventh layer 307, the sixth layer 306, . . . , down to the first layer 301, is denoted by arrows. The seventh layer 307 includes a lead-in part 307a for introducing the current. Each of the layers 301, 302, 303, 304, 305, 306, and 307 includes protrusions 301a, 301b, 302a, 302b, . . . , 307a, 307b so that the layers 301, 302, 303, 304, 305, 306, and 307 are electrically connected, respectively.

Another fact to which attention should be paid is that the layers 301, 302, 303, 304, 305, 306, and 307 are overlapped, respectively, thereby generating a parasitic capacitance. Accordingly, in designing the inductor 300, it is required to have way of reducing the parasitic capacitance.

In another aspect of the parasitic capacitance, attention should be paid to $f_{SRF}$ (Self Resonance Frequency). If the inductor is at a frequency band higher than a predetermined frequency, the inductance and capacitance cancel each other out. The frequency at which inductance and capacitance cancel each other out is the "$f_{SRF}$".

Accordingly, an inductor having too small a $f_{SRF}$ is not useful. In order to provide a $f_{SRF}$ of more than a predetermined value, overlap between the layers 301, 302, 303, 304, 305, 306, and 307 is avoided.

A relationship between the inductance and the parasitic capacitance is expressed in Equation (1) as follows:

$$f_{SRF} = \frac{1}{2\pi\sqrt{LC}} \quad (1)$$

As in Equation (1), the $f_{SRF}$ is inversely proportional to the parasitic capacitance and therefore, in order to secure the $f_{SRF}$ of more than a predetermined value, the overlap of the layers 301, 302, 303, 304, 305, 306, and 307 should be reduced, thereby reducing the parasitic capacitance.

Meantime, in designing the inductor 300 as in the present invention, the coil layers 301, 302, 303, 304, 305, 306, and 307 can be provided in plural, thereby effectively increasing the inductance.

Figure 4:
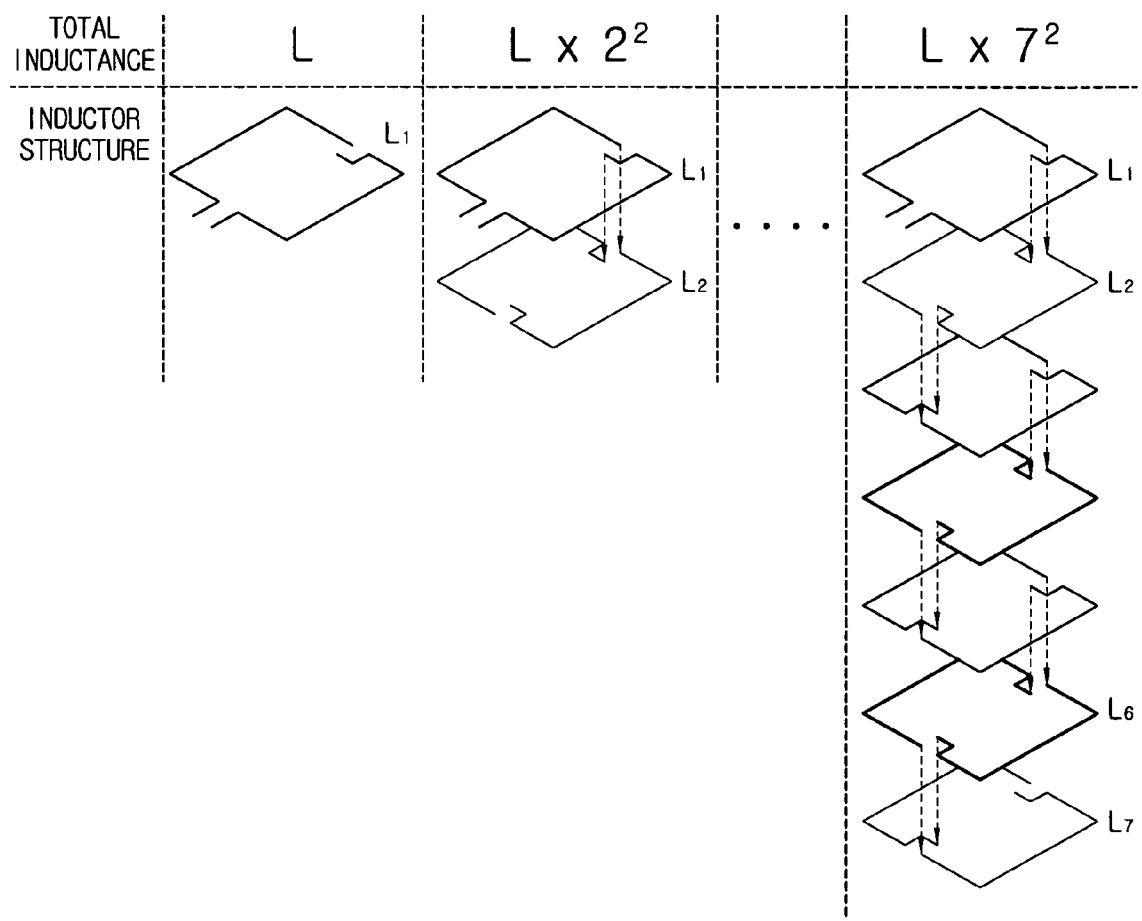
FIG. 4 illustrates a total inductance increasing as layers are laminated one by one.

In other words, referring to FIG. 4 illustrating a total inductance increasing as the layers 301, 302, 303, 304, 305, 306, and 307 are laminated one by one, assuming that an inductance obtained from one of the layers 301, 302, 303, 304, 305, 306, and 307 is denoted by the same symbol "L", a total inductance of the seventh layer 307 and the sixth layer 306 laminated is expressed as a sum (L×2²) of self inductances (L) and mutual inductances $M_{12}$ and $M_{21}$ of the seventh layer 307 and the sixth layer 306.

Equation (2) below obtains a mutual inductance between the sixth and seventh layers 306 and 307. It is assumed that a self inductance ($L_1$) obtained from the seventh layer 307 and a self inductance ($L_2$) obtained from the sixth layer 306 are identical with each other as the "L".

$$L_1 \sim L_2 \sim M_{12} \sim M_{21} = \sqrt{L_1 \times L_2} \qquad (2)$$

As in Equation (2), on the basis of the mutual inductances between the layers 301, 302, 303, 304, 305, 306, and 307, a total inductance obtained from the first to seventh layers 301, 302, 303, 304, 305, 306, and 307, all laminated, is expressed as "L×7²".

As such, in designing the inductor 300, in comparison to increasing of the size of the inductor 300 in a planar layout, it is very effective to laminate the layers 301, 302, 303, 304, 305, 306, and 307 in a vertical structure as in the present invention, in that the total inductance is remarkably increased.

In the above description, the layers constituting the inventive inductor 300 are limited in number to seven to the maximum, but this is only one example. It is of course possible to construct an inductor employing other plural coil layers, and remain within the scope of the present invention.

Figure 5:
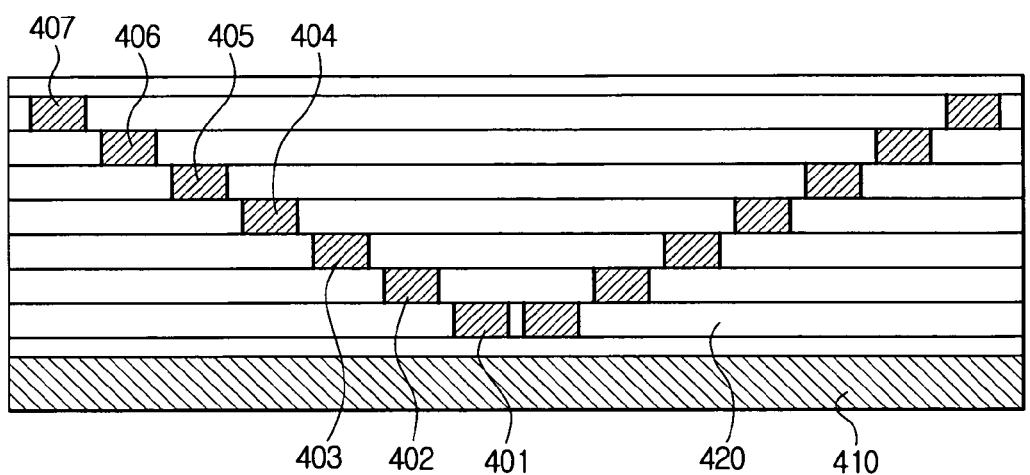
FIG. 5 is a sectional view illustrating an inductor according to the second exemplary embodiment of the present invention.

FIG. 5 is a sectional view illustrating an inductor according to the second exemplary embodiment of the present invention.

Referring to FIG. 5, the inventive inductor 400 includes a base wafer 410, the first through seventh layers 401, 402, 403, 404, 405, 406, and 407, and an insulating layer 420.

The base wafer 410 is a substrate being a base of the inductor 400, and is formed of insulating material such as silicon. The insulating layer 420 fills between the first to seventh layers 401, 402, 403, 404, 405, 406, and 407, with insulating material such as silicon.

Though not illustrated in FIG. 5, a current flows sequentially through the seventh layer 407, the sixth layer 406, . . . , the first layer 401, and the seventh layer 407 includes a lead-in part (not shown) for introducing the current, and each of the layers 401, 402, 403, 404, 405, 406, and 407, includes a protrusion part (not shown) for electrically connecting with another neighboring layer.

Each of the layers 401, 402, 403, 404, 405, 406, and 407 has a square open-loop shape, and the length of a side increases proportional to the distance from a surface of the base wafer 410, wherein the length of a side satisfies Equation (3), $$l_{n+1} \geq L_n \qquad (3)$$

where, $l_{n+1}$ is the length of a side of an inner square of a (n+1)-th layer, and $L_n$ is the length of a side of an outer square of an n-th layer.

In a detailed description of Equation 3, among the first to seventh layers 401, 402, 403, 404, 405, 406, and 407, constituted of square open-loop shaped coils, the seventh layer 407 has the largest size and in each subsequent layer, going toward the first layer 401, the size gets smaller.

In other words, the first to seventh layers 401, 402, 403, 404, 405, 406, and 407 constituting the inductor 400 are not provided in planar form, and are instead laminated in vertical form, thereby increasing a magnitude of a total inductance, and in addition, overlapping portions between the layers 401, 402, 403, 404, 405, 406, and 407 can be minimized, thereby reducing generation of parasitic capacitance and obtaining a high Q value.

Though later described in FIG. 10, but depending on each area of the first to seventh layers 401, 402, 403, 404, 405, 406, and 407, or each space between the layers 401, 402, 403, 404, 405, 406, and 407, a magnitude and a Q value of the total inductance are varied.

Figure 6:
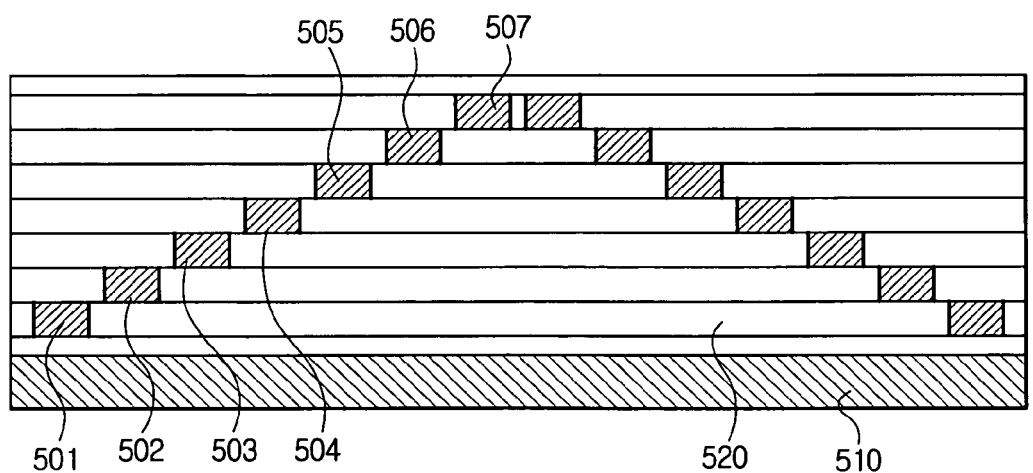
FIG. 6 is a sectional view illustrating an inductor according to the third exemplary embodiment of the present invention.

FIG. 6 is a sectional view illustrating an inductor according to the third exemplary embodiment of the present invention.

Referring to FIG. 6, the inductor 500 includes a base wafer 510, first to seventh layers 501, 502, 503, 504, 505, 506, and 507, and an insulating layer 520. Hereinafter, a duplicate description of the same structure or constituent elements of FIG. 5 will be omitted.

In each of the layers 501, 502, 503, 504, 505, 506, and 507, having square open-loop shapes, a length of a side increases proportional to a distance from a surface of the base wafer 510, and satisfies Equation (4), $$l_{n+1} \leq L_n \qquad (4)$$

where $l_{n+1}$ is the length of a side of an inner square of a (n+1)th layer, and $L_n$ is the length of a side of an outer square of an nth layer.

Among the first to seventh layers 501, 502, 503, 504, 505, 506, and 507 constituting the inductor 500, the first layer 501 has the largest size and, in each subsequent layer, going toward the seventh layer 507, the size gets smaller. In this case, there are not overlapping portions between the layers 501, 502, 503, 504, 505, 506, and 507, thereby reducing parasitic capacitance.

The inductor 500 is the same as the inductor 400 according to the second exemplary embodiment of the present invention, in that the layers 501, 502, 503, 504, 505, 506, and 507 are laminated in vertical, thereby increasing a total inductance, and the overlapping portions of between the layers 501, 502, 503, 504, 505, 506, and 507 are minimized in lamination, thereby reducing parasitic capacitance.

Figure 7:
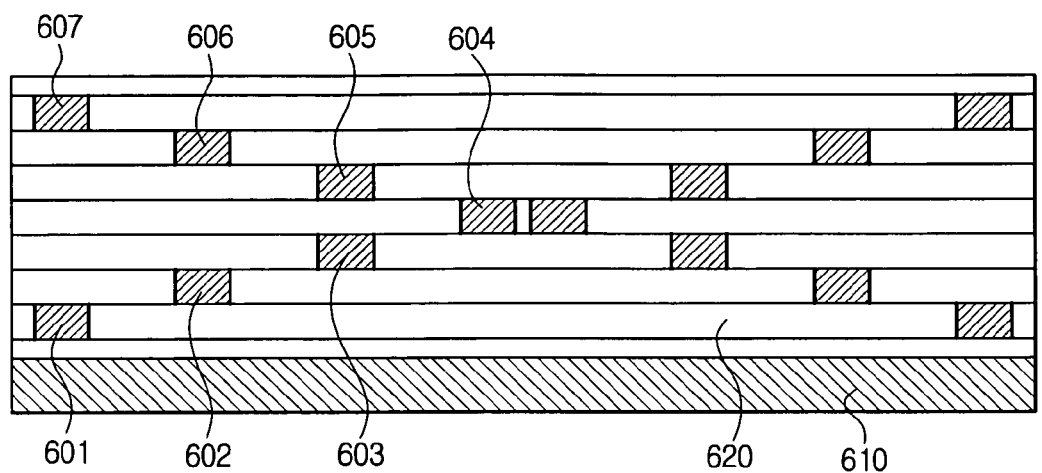
FIG. 7 is a sectional view illustrating an inductor according to the fourth exemplary embodiment of the present invention.

FIG. 7 is a sectional view illustrating an inductor according to the fourth exemplary embodiment of the present invention.

Referring to FIG. 7, the inductor 600 includes a base wafer 610, first to seventh layers 601, 602, 603, 604, 605, 606, and 607, and an insulating layer 620. Hereinafter, a duplicate description of the same structure or constituent elements will be omitted.

Among the first to seventh layers 601, 602, 603, 604, 605, 606, and 607 constituting the inductor 600, the fourth layer 604 has the least size and, going toward the first layer 601, the size gets larger and, going toward the seventh layer 607, the size gets larger.

Each of the layers 601, 602, 603, 604, 605, 606, and 607 constituting the inductor 600 has a partial overlapping portion but, due to great spaces between the overlapped layers, a parasitic capacitance is reduced, and in addition, the inductor 600 has a structure gradually increasing in size centering on the fourth layer 604, thereby reducing its total size.

Figure 8:
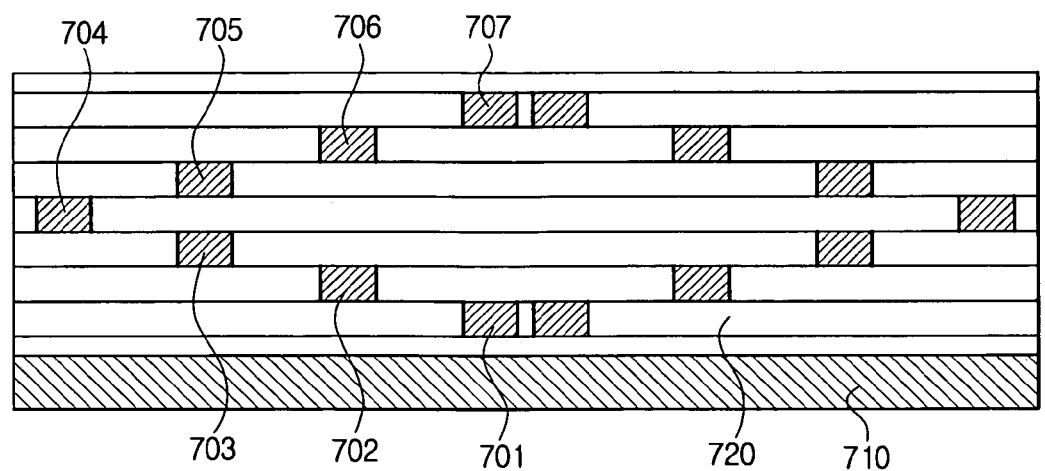
FIG. 8 is a sectional view illustrating an inductor according to the fifth exemplary embodiment of the present invention.

FIG. 8 is a sectional view illustrating an inductor according to the fifth exemplary embodiment of the present invention.

Referring to FIG. 8, the inductor 700 includes a base wafer 710, first to seventh layers 701, 702, 703, 704, 705, 706, and 707, and an insulating layer 720. Hereinafter, a duplicate description of the same structure or constituent elements will be omitted.

Among the first to seventh layers 701, 702, 703, 704, 705, 706, and 707 constituting the inductor 700, the fourth layer 704 has the largest size and, going toward the first layer 701 the size gets smaller and, going toward the seventh layer 707, the size gets smaller.

Like the inductor 600 according to the fourth exemplary embodiment of the present invention, in the inductor 700, each of the layers 601, 602, 603, 604, 605, 606, and 607 constituting the inductor 600 has an overlapping portion but, due to great spaces between the overlapped layers, parasitic capacitance is reduced and, in addition, an effect of reducing the size of the inductor 700 itself can be obtained.

Figure 9:
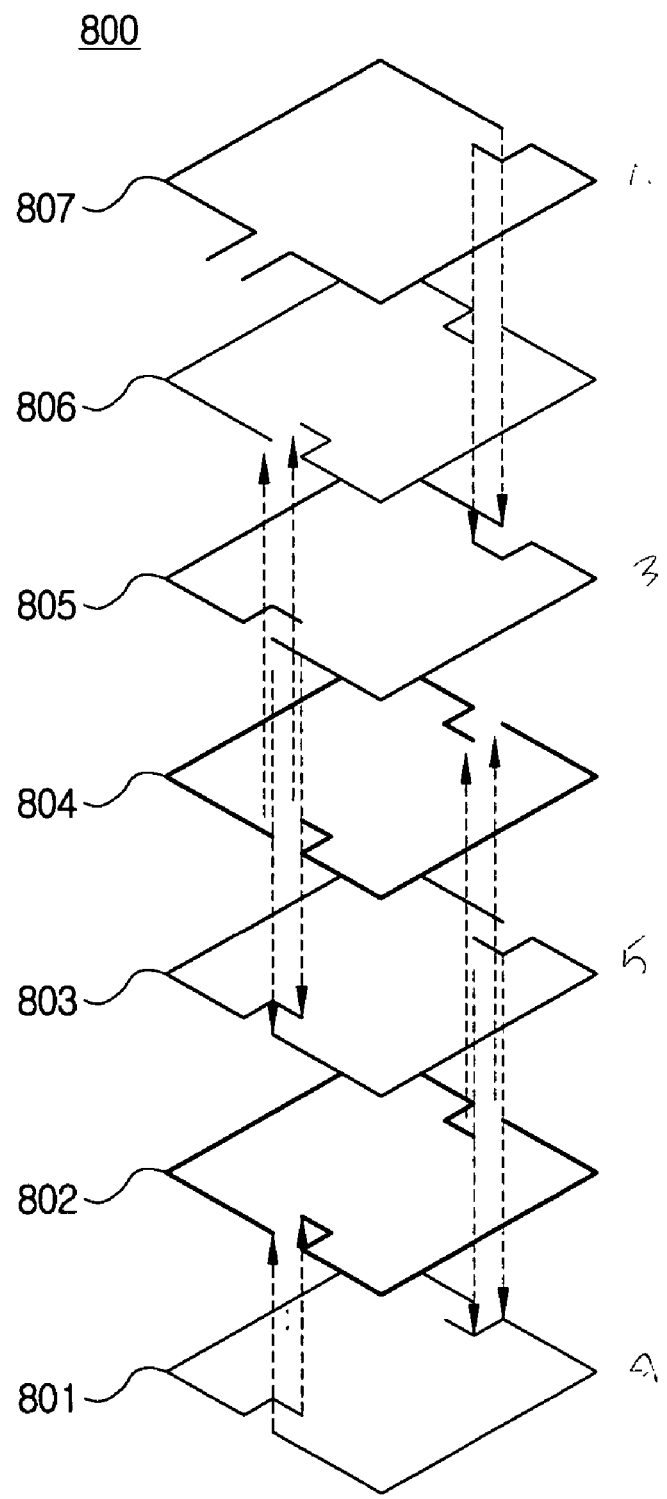
FIG. 9 is an exploded perspective view illustrating an inductor according to the sixth exemplary embodiment of the present invention.

FIG. 9 is an exploded perspective view illustrating an inductor according to the sixth exemplary embodiment of the present invention.

Referring to FIG. 9, the inductor 800 has first to seventh layers 801, 802, 803, 804, 805, 806, and 807 which are laminated. Each of the layers 801, 802, 803, 804, 805, 806, and 807, has a left and right symmetric coil, and is comprised of a coil of a single one line form extended so that current can flow.

FIG. 9 illustrates flow of the current. Unlike the inductor 300 according to the first embodiment, the current flowing along each of the layers 801, 802, 803, 804, 805, 806, and 807 constituting the inductor 800 flows along the seventh layer 807, the fifth layer 805, the third layer 803, and the first layer 801 and again, sequentially flows along the second layer 802, the fourth layer 804, and the sixth layer 806.

Unlike the first exemplary embodiment where the current flows sequentially through each of the layers, according to the sixth embodiment, the current flows bypassing one neighboring layer, thereby increasing the total inductance and in addition, reducing parasitic capacitance.

In FIG. 3, the current sequentially flowing through the seventh layer 307, the sixth layer 306, ..., the first layer 301 is denoted by the arrow. The seventh layer 307 includes a lead-in part 307a for introducing the current. Each of the layers 301, 302, 303, 304, 305, 306, and 307 includes protrusions 301a, ... 301b, ..., 307a, 307b so that the layers 301, 302, 303, 304, 305, 306, and 307 are electrically connected, respectively.

Another aspect to which attention should be paid is that the layers 301, 302, 303, 304, 305, 306, and 307 are overlapped, respectively, thereby increasing parasitic capacitance. Accordingly, in designing the inductor 300, it is desired to have an way of reducing parasitic capacitance.

In another aspect of the parasitic capacitance, attention should be paid to the $f_{SRF}$ (Self Resonance Frequency). If the inductor is at a frequency band greater than a predetermined frequency, the inductance and capacitance cancel each other out. The frequency when the inductance and capacitance cancel each other out is called "$f_{SRF}$".

Accordingly, an inductor having too small a $f_{SRF}$ is not useful. In order to provide a $f_{SRF}$ of more than a predetermined value, overlap between the layers 301, 302, 303, 304, 305, 306, and 307 is minimized.

FIG. 10 is a table comparing several measurement values determining performances of inductors according to several embodiments of the present invention.

First, in the label "L200W4S6," indicated in a row of the table, "L" denotes the length of one side of the largest square of the square open-loop shaped layers employed in the inductor, "W" denotes the width of a coil of each layer, and "S" denotes the space between the layers. Accordingly, "L200W4S6" means a length (L) of 200 μm, a width (W) of 4 μm, and a space (S) of 6 μm. Additionally, "L," as indicated in the leftmost column of the table of FIG. 10, denotes a total inductance, and "$Q_{max}$" denotes a maximal Q value.

Accordingly, results obtained by comparing the structures of the second to fifth embodiments shown in FIGS. 5 to FIG. 8 will be described as follows.

In L200W4S6 of FIG. 5, the length (L) is 7.66 nH at a frequency of 0.5 GHz, the SRF is 5.86 GHz, and the $Q_{max}$ is 3.18 at a frequency of 3 GHz. In L200W4S6 of FIG. 6, the length (L) is 7.776 nH at the frequency of 0.5 GHz, the SRF 5.3 GHz, and the $Q_{max}$ is 2.5 at a frequency of 2.8 GHz.

In L200W4S6 of FIG. 7, the length (L) is 14.14 nH at the frequency of 0.5 GHz, the SRF is 5.86 GHz, and the $Q_{max}$ is 3.18 at the frequency of 3 GHz. In L200W4S6 of FIG. 8, the length (L) is 12.67 nH at the frequency of 0.5 GHz, the SRF is 4 GHz, and the $Q_{max}$ is 3 at a frequency of 2.2 GHz.

Describing such results, the inductors according to the second and third embodiments of FIGS. 5 and 6 are excellent structures in view of the SRF and the $Q_{max}$ determining the performance of the inductor, and the inductors according to the fourth and fifth embodiments of FIGS. 7 and 8 can be embodied to have smaller structures and therefore, can be excellent structures in view of the size.

In L200W4S2 of FIG. 5, the length (L) is 12.57 nH at the frequency of 0.5 GHz, the SRF is 4.07 GHz, and the $Q_{max}$ is 2.86 at a frequency of 2.1 GHz. In L200W4S2 of FIG. 6, the length (L) is 11.95 nH at the frequency of 0.5 GHz, the SRF 3.7 GHz, and the $Q_{max}$ is 2.44 at a frequency of 1.9 GHz.

In L200W4S2 of FIG. 7, the length (L) is 16.66 nH at the frequency of 0.5 GHz, the SRF is 3.42 GHz, and the $Q_{max}$ is 2.81 at the frequency of 3 GHz. In L200W4S2 of FIG. 8, the length (L) is 16.22 nH at the frequency of 0.5 GHz, the SRF is 3.44 GHz, and the $Q_{max}$ is 2.7 at a frequency of 1.7 GHz.

The L200W4S2 is a structure where the space between the layers is designed differently from the above-described L200W4S6, but the other variables are identical. In comparison with the above two cases, the L200W4S6 is excellent in view of the total inductance generated from the inductor, but the L200W4S2 is excellent in view of the SRF and the $Q_{max}$ determining the performance of the inductor.

In L200W8S2 of FIG. 7, a length (L) is 13.16 nH at the frequency of 0.5 GHz, a SRF is 3.6 GHz, and a $Q_{max}$ is 4.45 at the frequency of 1.7 GHz.

The L200W8S2 is a structure where just only the width of the coil of the layer is designed differently from the above-described L200W4S2 and other variables are identical. In comparison of the above two cases, the L200W4S2 is excellent in view of the inductance generated from the inductor, but the L200W8S2 is excellent in view of the SRF and the $Q_{max}$ determining the performance of the inductor.

As described above, in the present invention, when designed, the inductor is constituted of plural coils, thereby decreasing in size and not only increasing in total inductance but also improving the Q value determining the performance of the inductor.

The foregoing exemplary embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. An inductor comprising:
  a base wafer;
  a plurality of insulating layers sequentially laminated on one surface of the base wafer; and a plurality of coil layers built in the plurality of insulating layers, respectively, and having different magnetic flux passage areas, wherein adjacent coil layers of the plurality of coil layers do not overlap, wherein the adjacent coil layers are not separated by any other coil layers, wherein each of the plurality of coil layers are square open-loop shaped coils having a side, a width, and a height of predetermined lengths, and wherein each of the plurality of insulating layers has a single coil layer having a single square open-loop shaped coil.

2. The inductor as claimed in claim 1, wherein each of the plurality of coil layers has a protrusion electrically connected the other predetermined layer.

3. The inductor as claimed in claim 1, wherein the magnetic flux passage area is proportional to the length of the side.

4. The inductor as claimed in claim 1, wherein the length of the side increases proportional to a distance increasing from a surface of the base wafer, and satisfies the equation, $$l_{n+1} \geq L_n$$

where $l_{n+1}$ is the length of a side of an inner square of a (n+1)th layer, and $L_n$ is the length of a side of an outer square of an n-th coil layer.

5. The inductor as claimed in claim 1, wherein the length of the side decreases proportional to a distance increasing from a surface of the base wafer, and satisfies the following equation, $$l_{n+1} \geq L_n$$

where $l_{n+1}$ is the length of a side of an inner square of a (n+1)th layer, and $L_n$ is the length of a side of an outer square of an n-th coil layer.

6. The inductor as claimed in claim 1, wherein the length of the side increases as getting distant from a vertically centered one of the plurality of coil layers.

7. The inductor as claimed in claim 1, wherein the length of the side decreases as getting distant from a vertically centered one of the plurality of coil layers.

8. An inductor as claimed in claim 1, wherein a current flows sequentially through each of the coil layers.

9. An inductor as claimed in claim 1, wherein a current flows through odd-numbered coil layers and then through the even numbered coil layers.

10. The inductor as claimed in claim 1, wherein a coil layer of the plurality of coil layers which is farthest in distance from a surface of the base wafer comprises a lead-in part for introducing a current.

* * * * *